(12) United States Patent
Yang

(10) Patent No.: US 6,555,473 B2
(45) Date of Patent: Apr. 29, 2003

(54) FIELD EFFECT TRANSISTORS AND METHODS OF FORMING A FIELD EFFECT TRANSISTOR

(75) Inventor: Haining Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/033,428

(22) Filed: Dec. 27, 2001

(65) Prior Publication Data

US 2002/0052101 A1 May 2, 2002

Related U.S. Application Data

(62) Division of application No. 09/865,910, filed on May 24, 2001, now Pat. No. 6,475,856, which is a division of application No. 09/388,731, filed on Sep. 1, 1999, now Pat. No. 6,391,801.

(51) Int. Cl.[7] .................... H01L 21/44; H01L 21/3205; H01L 29/76
(52) U.S. Cl. ................... 438/685; 438/586; 438/683; 438/785; 257/410
(58) Field of Search ................... 438/586, 683, 438/685, 785; 427/126.3; 257/253, 410

(56) References Cited

U.S. PATENT DOCUMENTS

| | | |
|---|---|---|
| 3,964,085 A | 6/1976 | Kahng et al. |
| 4,733,328 A | 3/1988 | Blazej |
| 4,745,082 A | 5/1988 | Kwok |
| 4,971,655 A | 11/1990 | Stefano et al. |
| 5,189,503 A | 2/1993 | Suguro et al. |
| 5,290,609 A | 3/1994 | Horiike et al. |
| 5,336,638 A | 8/1994 | Suzuki et al. |
| 5,342,648 A | 8/1994 | MacKenzie et al. |
| 5,394,000 A | 2/1995 | Ellul et al. |
| 5,661,319 A | 8/1997 | Fujii et al. |
| 5,874,770 A | 2/1999 | Saia et al. |
| 5,888,588 A | * 3/1999 | Nagabushnam et al. . 427/248.1 |
| 5,930,584 A | 7/1999 | Sun et al. ....................... 438/3 |
| 5,977,583 A | 11/1999 | Hosotani et al. ............ 257/311 |
| 6,159,835 A | * 12/2000 | Visokay et al. ............. 438/592 |
| 6,391,801 B1 | * 5/2002 | Yang .......................... 438/785 |

* cited by examiner

Primary Examiner—Alexander Ghyka
(74) Attorney, Agent, or Firm—Wells St. John P.S.

(57) ABSTRACT

The invention includes capacitors, capacitor forming methods, field effect transistors, and field effect transistor forming methods. In one aspect, a method of forming a layer including tungsten oxide includes forming a first layer including tungsten nitride over a substrate. In one implementation, the tungsten nitride is oxidized under conditions effective to form a second layer at least a majority of which is tungsten trioxide. In one aspect, a capacitor forming method includes forming a first capacitor electrode layer over a substrate. A second layer including tungsten nitride is formed over the first capacitor electrode layer. A third capacitor electrode layer is formed over the second layer. The second layer is oxidized under conditions effective to transform at least some of the tungsten nitride into a tungsten trioxide comprising capacitor dielectric layer. Other capacitor forming methods are contemplated. The invention also includes capacitors formed by these and other methods. In one aspect, a method of forming a field effect transistor includes forming a tungsten nitride comprising layer proximate at least one of a semiconductive channel region or a conductive gate layer. The tungsten nitride comprising layer is oxidized under conditions effective to transform at least some of the tungsten nitride to a tungsten oxide comprising gate dielectric layer. A transistor gate is provided operably proximate the gate dielectric layer, and source/drain regions are provided operably proximate the transistor gate. The invention also includes field effect transistors formed by this and other methods.

34 Claims, 7 Drawing Sheets

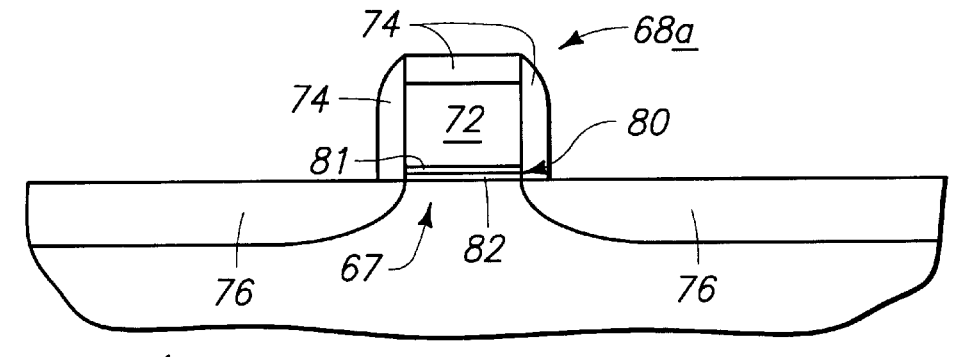
_FIG. 17_
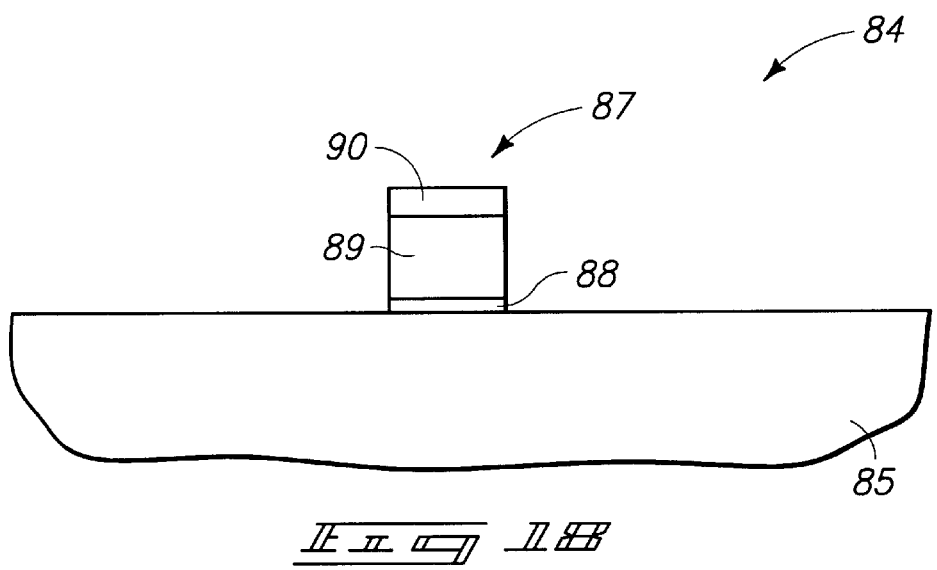
_FIG. 18_
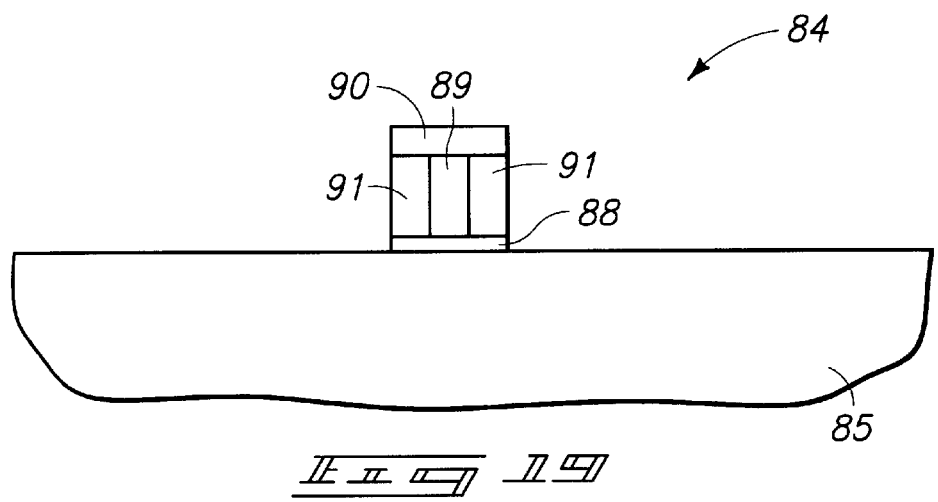
_FIG. 19_

FIELD EFFECT TRANSISTORS AND METHODS OF FORMING A FIELD EFFECT TRANSISTOR

RELATED PATENT DATA

This patent resulted from a divisional application of U.S. patent application Ser. No. 09/865,910, filed May 24, 2001 now U.S. Pat. No. 6,475,856, entitled "Capacitors and Capacitor Forming Methods" (as Amended) naming Haining Yang as inventor, the disclosure of which is incorporated by reference; which application resulted from a divisional application of U.S. patent application Ser. No. 09/388,731, filed Sep. 1, 1999 now U.S. Pat. No. 6,391,801, entitled "Method of Forming a Layer Comprising Tungsten Oxide" (as Amended), naming Naming Yang as inventor, the disclosure of which is incorporated by reference.

TECHNICAL FIELD

This invention relates to capacitors and capacitor forming methods. This invention also related to field effect transistors, and to methods of forming field effect transistors.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron or less, and conventional dielectrics such as $SiO_2$ and $Si_3N_4$ might not be suitable because of small dielectric constants.

Insulating inorganic metal oxide materials, such as ferroelectric materials or perovskite materials or pentoxides such as tantalum pentoxide, have high dielectric constants and low leakage current which make them attractive as cell dielectric materials for high density DRAMs and non-volatile memories. Despite the advantages of high dielectric constants and low leakage, insulating inorganic metal oxide materials suffer from many drawbacks. For example, all of these materials incorporate oxygen or are otherwise exposed to oxygen for densification to produce the desired capacitor dielectric layer. Unfortunately, the provision of such layers or subjecting such layers to oxidation densification can undesirably oxidize the underlying bottom or lower storage node electrode where such is made of a readily oxidizable material. For example, $Ta_2O_5$ is typically subjected to an anneal in the presence of an oxygen ambient. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing one or more of $O_3$, $N_2O$ and $O_2$. The oxygen containing gas is typically flowed through a reactor at a rate of from about 0.5 slm to about 10 slm.

Dielectric materials are also used for gate dielectric regions in field effect transistors between a conductive gate and a semiconductive channel region. This invention is directed to improved methods and constructions associated with transistors and capacitors, particularly where higher dielectric constants are desired.

SUMMARY

The invention comprises capacitors, capacitor forming methods, field effect transistors, and field effect transistor forming methods. In one aspect, a method of forming a layer including tungsten oxide includes forming a first layer including tungsten nitride over a substrate. In one implementation, the tungsten nitride layer is oxidized under conditions effective to form a second layer which comprises tungsten oxide. In one implementation, the tungsten nitride is oxidized under conditions effective to form a second layer at least a majority of which is tungsten trioxide. In one aspect, a capacitor forming method includes forming a first capacitor electrode layer over a substrate. A second layer including tungsten nitride is formed over the first capacitor electrode layer. A third capacitor electrode layer is formed over the second layer. The second layer is oxidized under conditions effective to transform at least some of the tungsten nitride into a tungsten trioxide comprising capacitor dielectric layer. Other capacitor forming methods are contemplated. The invention also includes capacitors formed by these and other methods.

In one aspect, a method of forming a field effect transistor includes forming a tungsten nitride comprising layer proximate at least one of a semiconductive channel region or a conductive gate layer. The tungsten nitride comprising layer is oxidized under conditions effective to transform at least some of the tungsten nitride to a tungsten oxide comprising gate dielectric layer. A transistor gate is provided operably proximate the gate dielectric layer, and source/drain regions are provided operably proximate the transistor gate. The invention also includes field effect transistors formed by this and other methods.

BRIEF DESCRIPTION OF THE DRAWINGS

Preferred embodiments of the invention are described below with reference to the following accompanying drawings.

FIG. 17 is a diagrammatic sectional view of another alternate embodiment semiconductor wafer fragment at a processing step in accordance with an aspect of the invention.

FIG. 18 is a diagrammatic sectional view of still another alternate embodiment semiconductor wafer fragment at a processing step in accordance with an aspect of the invention.

FIG. 19 is a view of the FIG. 18 wafer fragment at a processing step subsequent that shown by FIG. 18.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
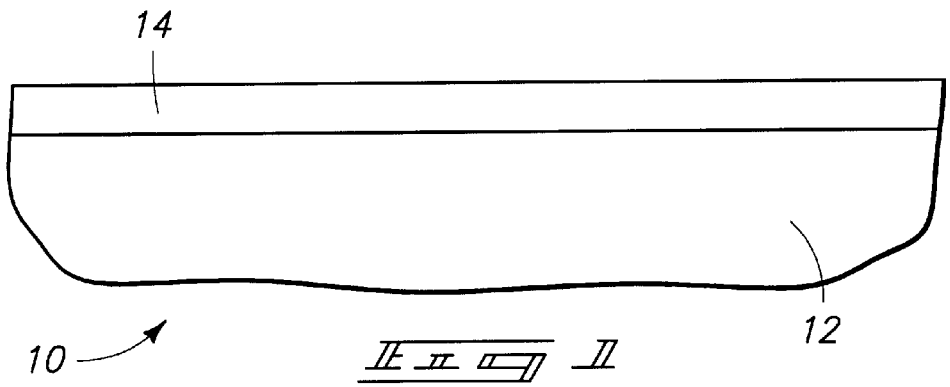
FIG. 1 is a diagrammatic sectional view of a semiconductor wafer 1. fragment at one processing step in accordance with an aspect of the invention.
Figure 2:
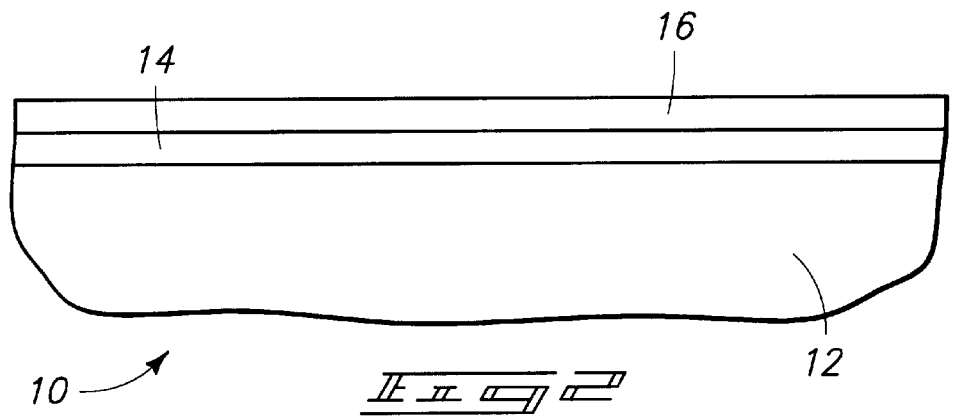
FIG. 2 is a view of the FIG. 1 wafer at a processing step subsequent to that shown by FIG. 1.
Figure 3:
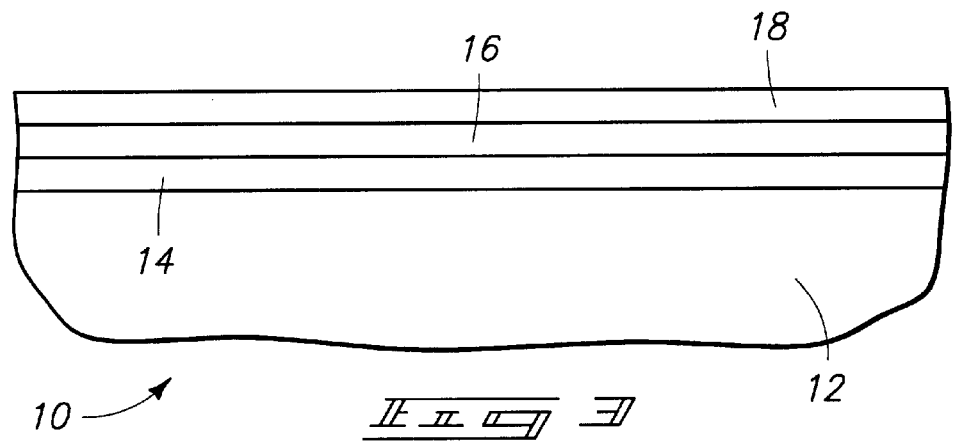
FIG. 3 is a view of the FIG. 2 wafer fragment at a processing step subsequent to that shown by FIG. 2.

Referring initially to FIGS. 1–3, a method of forming a layer comprising tungsten oxide is described. In the context of this document, "tungsten oxide" defines any of $WO_x$, where "x" ranges from 1 to 3. In the depicted process, the method is described in conjunction with a capacitor forming method. FIG. 1 depicts a substrate in process indicated generally with reference numeral 10. Such comprises a base or underlying layer/region 12 having a first capacitor electrode layer 14 formed thereover. Region 12 might be comprised of a semiconductive substrate, such as a bulk monocrystalline silicon substrate having a diffusion region formed therein (not shown). Also by way of example only, layer/region 12 might constitute an insulating layer or combination of insulating and conductive and semiconductive layers. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In one preferred embodiment, layer 14 comprises tungsten nitride, and even more preferably consists essentially of tungsten nitride, deposited to an example thickness of from about 150 Angstroms to about 500 Angstroms. In the context of this document, "tungsten nitride" defines any of $WN_x$, where "x" ranges from 0.2 to 5.0. Layer 14 can be deposited or formed by any suitable technique, with low pressure chemical vapor deposition (LPCVD) being one example. Where, for example, layer 14 is to comprise or consist essentially of tungsten nitride, example precursor gases include $WF_6$, $NH_3$, $H_2$ and Ar. For a single wafer six liter processor, example gas flows rates include $WF_6$ at from about 2 sccm to about 50 sccm, $NH_3$ at from 6 sccm to 150 sccm, $H_2$ at from about 50 sccm to about 800 sccm, and Ar at from about 0 sccm to about 500 sccm. The wafer temperature is preferably maintained at from about 300° C. to 700° C., with processor pressure being maintained at from about 50 mTorr to 600 mTorr.

Referring to FIG. 2, at least some of the tungsten nitride of layer 14 is oxidized under conditions effective to form a second layer 16 which comprises tungsten oxide, and more preferably at least a majority of which comprises tungsten trioxide. As shown in FIG. 2, the oxidizing oxidizes only an outer portion of first layer 14 to form second layer 16, which in this example is in contact with first capacitor electrode layer 14. Further, layer 16 constitutes a first capacitor dielectric layer in the capacitor being formed in this exemplary preferred implementation. Example preferred oxidizing includes dry oxidizing and/or wet oxidizing. Exemplary dry oxidizing comprises placing a substrate in a RTO or other oxidization chamber, and conducting oxidizing with or without plasma, and/or with or without ultraviolet light. An exemplary wafer susceptor temperature during the oxidizing is from about 200° C. to about 800° C., with an exemplary pressure range being from about 200 mTorr to above atmospheric pressure. Preferred oxidizing gases include $O_2$, $O_3$, oxygen radical, $N_2O$, $NO_2$, NO, and mixtures thereof. Exemplary flow rates for such gases include from about 2 sccm to about 10 slm. Carrier gases such as Ar and/or He might also be included, with an exemplary flow rate being from about 3 sccm to about 5 slm. Processing time might range anywhere from a few seconds to several minutes, or more. The processing of a tungsten nitride layer under such conditions is typically largely self-limiting in tungsten trioxide growth to about 300 Angstroms thickness. A preferred power where plasma is utilized is from 50 watts to about 1000 watts in a dual plate, capacitively coupled reactor. Further alternately where plasma is utilized, remote plasma might be used. Other embodiments, for example using ultraviolet light, may of course be used.

The volume differential of $WO_3$ versus tungsten nitride is about 2:1. Accordingly where $WO_3$ is the preferred form of $WO_x$, an exemplary preferred processing is to oxidize about half of the thickness of layer 14 to produce layer 16 to be equal in thickness to the resulting layer 14.

One example wet oxidization process includes dipping the substrate in a $H_2O_2$ solution. Such solution might constitute 100% $H_2O_2$ or, by way of example, 100 parts of $H_2O$ to 1 part of $H_2O_2$ (by weight). An exemplary temperature for the dipping includes 95° C. at ambient pressure. Alternate wet oxidizing includes exposing the substrate to a $H_2O$ bath comprising $O_3$, such as by bubbling ozone through an elevated temperature water bath.

The subject oxidizings might form other forms of tungsten oxide including, by way of example only, tungsten dioxide and/or $WO_{2.72}$ in $W_{18}O_{49}$ form. Most preferably, the subject oxidizings produce layer 16 to consist essentially of tungsten oxide in the tungsten trioxide form. Tungsten trioxide has a dielectric constant of about 300 compared to is about 40 for tungsten dioxide. Provision of a tungsten trioxide layer in the above-described manners is considerably preferred over a direct chemical vapor deposition of tungsten trioxide, due to a better capacitor film being produced.

Referring to FIG. 3, a second capacitor electrode layer 18 is formed over capacitor dielectric layer 16. Layer 18 preferably comprises, and more preferably consists essentially of, tungsten nitride. Capacitor dielectric layer 16 constitutes a capacitor dielectric region received intermediate first capacitor electrode 14 and second capacitor electrode 18. In the preferred embodiment, first and second capacitor electrode layers 14 and 16, respectively, are in contact with tungsten trioxide of first capacitor dielectric layer 16. A preferred thickness for layer 18 is from about 50 Angstroms to about 500 Angstroms.

Figure 4:
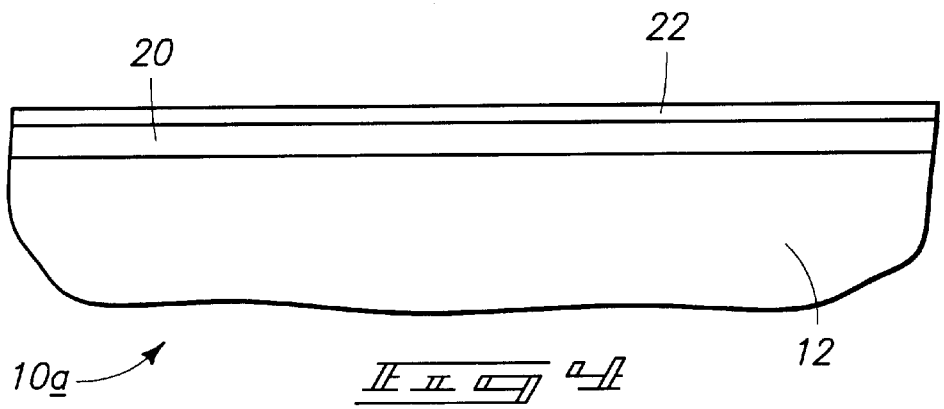
FIG. 4 is a diagrammatic sectional view of an alternate embodiment semiconductor wafer fragment at a processing step in accordance with the invention.

The above-described example showed oxidizing only a portion of first layer 14 to form second layer 16. Alternate exemplary processing is described with reference to FIGS. 4 and 5. Like numerals from the first described embodiment are utilized where appropriate, with differences being indicated with different numerals or the suffix "a". FIG. 4 illustrates a substrate 10a having a first capacitor electrode layer 20 formed over a suitable substrate 12. A second layer 22 comprising tungsten nitride is formed over first capacitor electrode layer 20. First capacitor electrode layer 20 ideally does not comprise any tungsten nitride. Example materials for layer 20 include platinum, rhodium oxide, ruthenium oxide, titanium oxide, and other noble metals and conducting or semiconductive oxides.

Figure 5:
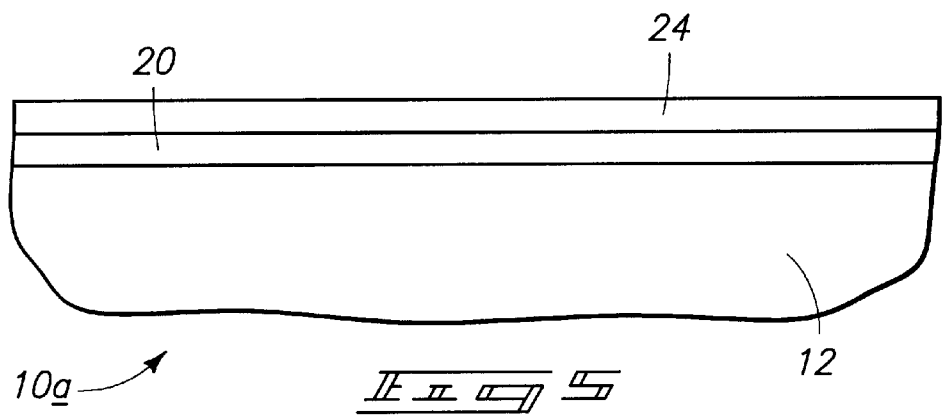
FIG. 5 is a view of the FIG. 4 wafer fragment at a processing step subsequent to that shown by FIG. 4.

Referring to FIG. 5, wafer fragment 10a has been exposed to oxidizing conditions effectively to oxidize essentially all of first layer 22 to form a second capacitor electrode layer 24 comprising tungsten oxide, and more preferably that consists essentially of tungsten trioxide.

Figure 6:
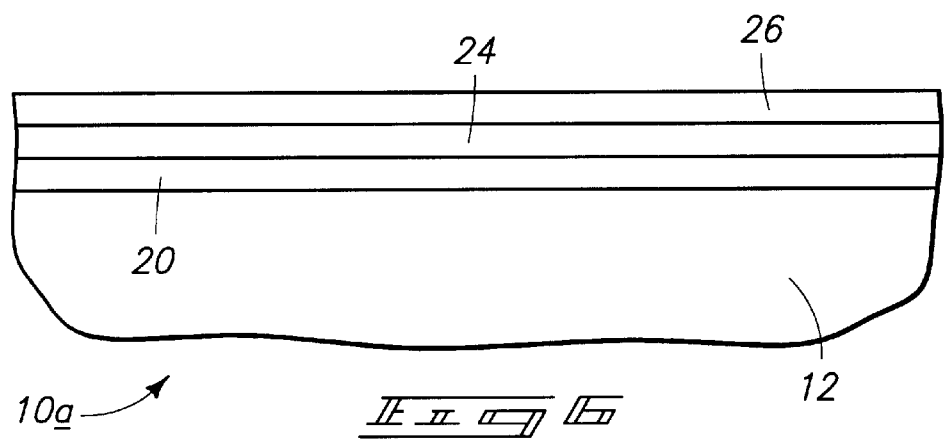
FIG. 6 is a view of the FIG. 4 wafer fragment at a processing step subsequent to that shown by FIG. 5.

Referring to FIG. 6, a third capacitor electrode layer 26 is formed over second capacitor electrode layer 24. Example materials for layer 26 include tungsten nitride, tungsten, ruthenium oxide, titanium nitride, platinum, aluminum and copper.

Figure 7:
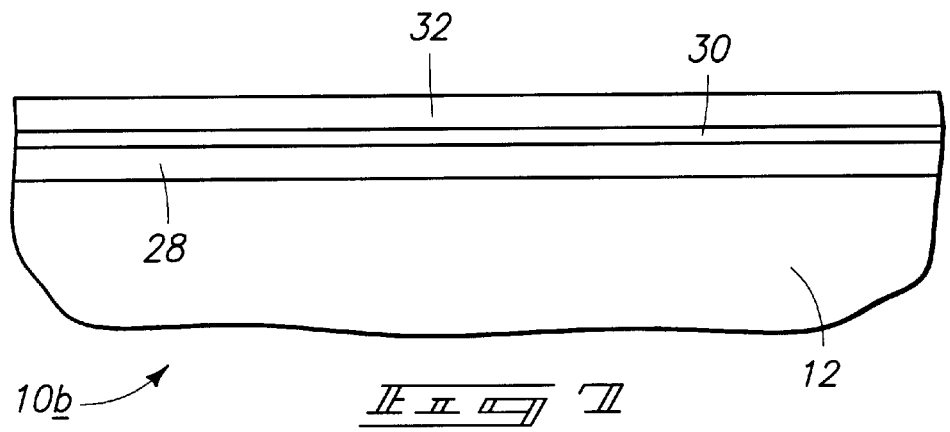
FIG. 7 is a diagrammatic sectional view of an alternate embodiment semiconductor wafer fragment at a processing step in accordance with the invention.
Figure 8:
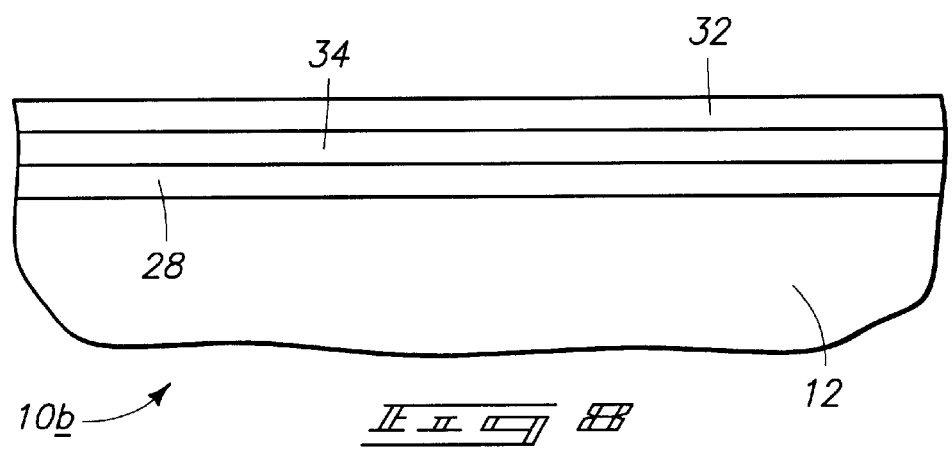
FIG. 8 is a view of the FIG. 7 wafer at a processing step subsequent to that shown by FIG. 7.

The above-described processings showed the oxidizings occurring before the outer capacitor electrode layer was formed. The exemplary embodiment of FIGS. 7 and 8 shows processing whereby oxidizing occurs after forming of the outer capacitor electrode layer. Like numerals from the first embodiment are utilized where appropriate, with differences being indicated with different numerals or with the suffix "b". FIG. 7 illustrates a wafer fragment 10b having a first capacitor electrode layer 28 formed over a substrate layer 12. A tungsten nitride comprising layer 30, preferably consisting essentially of tungsten nitride, is formed over layer 28. A third or outer capacitor electrode layer 32 is formed over layer 30. The composition of layer 32 is ideally chosen to comprise a conductive material diffusive to oxygen and which itself does not oxidize, or does oxidize to form a conductive oxide. Example materials include platinum, platinum alloy, ruthenium, ruthenium oxide, rhodium, rhodium oxide, or titanium.

Referring to FIG. 8, wafer fragment 10b has been subjected to suitable oxidizing conditions, such as described above, effective to transform at least some of the tungsten nitride, and preferably all as shown, into a tungsten trioxide comprising capacitor dielectric layer 34.

Figure 9:
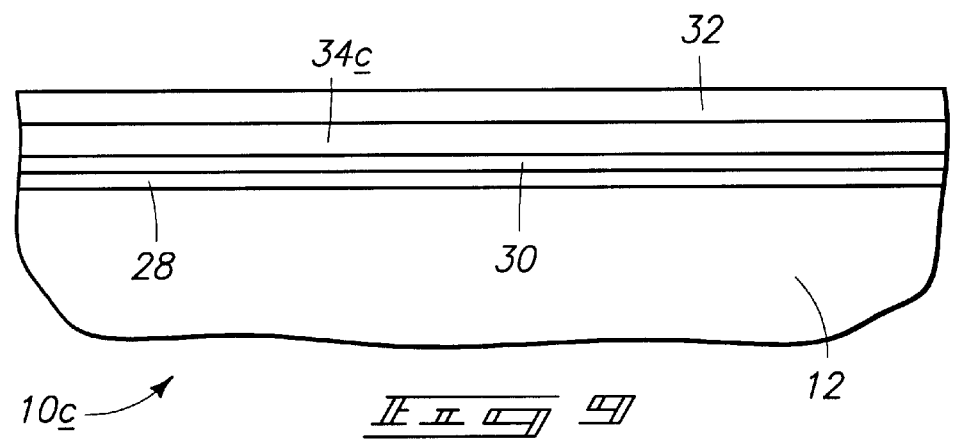
FIG. 9 is a diagrammatic sectional view of another alternate embodiment semiconductor wafer fragment in accordance with an aspect of the invention.

FIG. 9 illustrates an alternate embodiment 10c, whereby only some of the tungsten nitride of layer 30 has been transformed into a tungsten oxide layer 34c.

Figure 10:
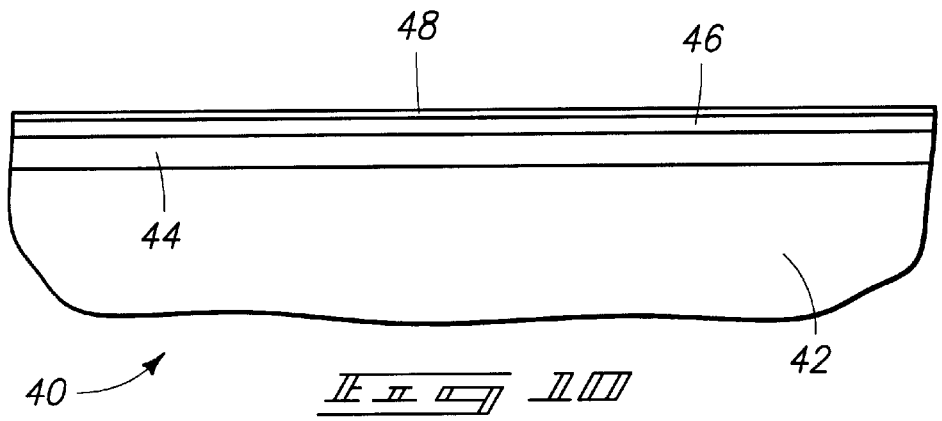
FIG. 10 is a diagrammatic sectional view of still another alternate embodiment semiconductor wafer fragment in accordance with an aspect of the invention.

Another alternate embodiment is described with reference to FIGS. 10–12. FIG. 10 depicts a wafer fragment 40 comprised of a substrate region or layer 42 having a first capacitor electrode layer 44 formed thereover. An exemplary preferred material for layer 44 is tungsten nitride. A high k dielectric layer 46 is formed over first capacitor electrode layer 44. In the context of this document, "high k" denotes any material having a dielectric constant of at least 20. An exemplary and preferred material for layer 46 comprises $Ta_2O_5$ deposited by any suitable technique, such as by chemical vapor deposition. A tungsten nitride comprising layer 48 is formed over high k dielectric layer 46.

Figure 11:
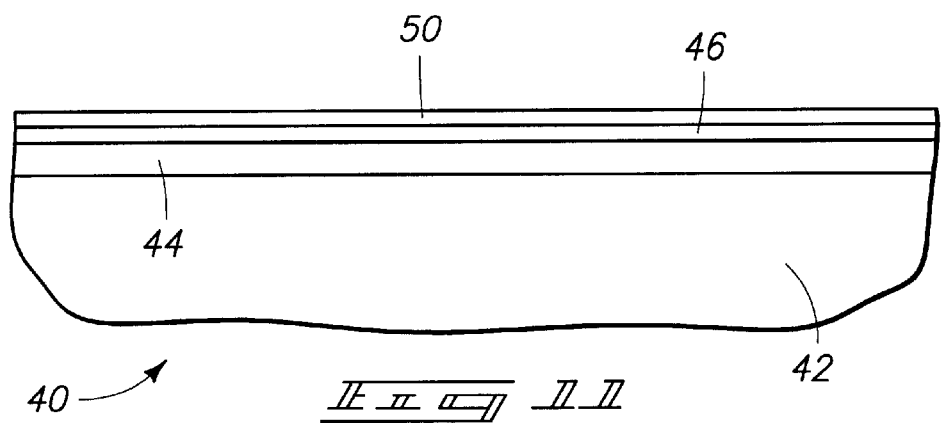
FIG. 11 is a view of the FIG. 10 wafer fragment at a processing step subsequent to that shown by FIG. 10.

Referring to FIG. 11, substrate 40 is subjected to suitable oxidizing conditions to oxidize the tungsten nitride of layer 48 effective to transform substantially all of it to a tungsten oxidize comprising layer 50 received over high k capacitor dielectric layer 46. At least a majority portion of the tungsten oxide is preferably in tungsten trioxide form, with layer 50 more preferably consisting essentially of tungsten trioxide.

Figure 12:
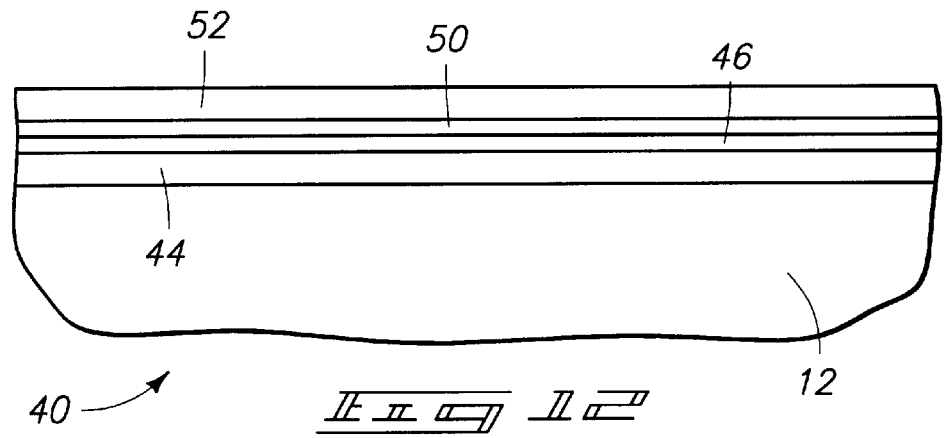
FIG. 12 is a view of the FIG. 10 wafer fragment at a processing step subsequent to that shown by FIG. 11.

Referring to FIG. 12, a second capacitor electrode layer 52 is formed over tungsten oxide comprising layer 50. Layer 52 preferably comprises, and more preferably consists essentially of, tungsten nitride.

Figure 13:
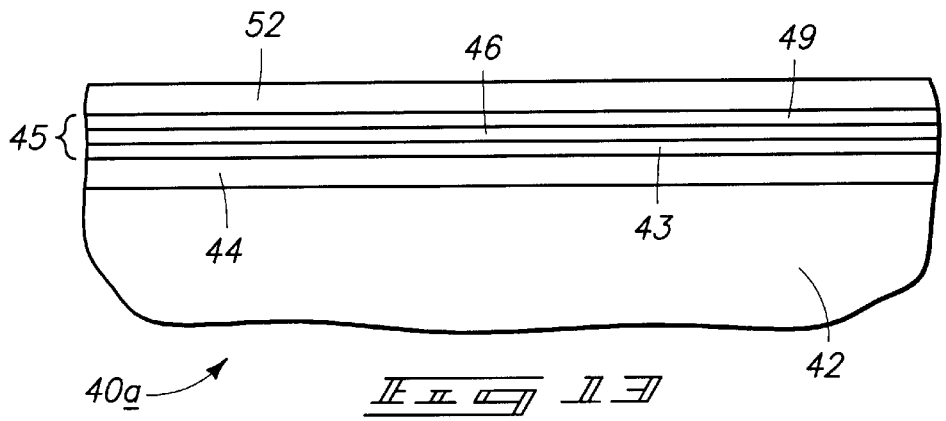
FIG. 13 is a diagrammatic sectional view of another alternate embodiment semiconductor wafer fragment at a processing step in accordance with an aspect of the invention.

Another alternate embodiment is depicted in a wafer fragment 40a in FIG. 13. Like numerals from the FIGS. 10–12 embodiment have been utilized where appropriate, with differences being indicated with different numerals, or with the suffix "a". FIG. 13 depicts a capacitor dielectric region 45 received intermediate first capacitor electrode layer 44 and second capacitor electrode layer 52. Capacitor dielectric region 45 comprises a first tungsten trioxide comprising layer 43 (preferably consisting essentially of tungsten trioxide) in contact with first capacitor electrode layer 44. A second tungsten trioxide comprising layer 49 (preferably consisting essentially of tungsten trioxide) is received in contact with second capacitor electrode 52. A high k dielectric layer 46 is received intermediate first tungsten trioxide comprising layer 43 and second tungsten trioxide comprising layer 49. Accordingly in the preferred implementation, high k dielectric layer 46 contacts both first tungsten trioxide layer 43 and second tungsten trioxide comprising layer 49. A preferred material for layer 46 is $Ta_2O_5$.

Figure 14:
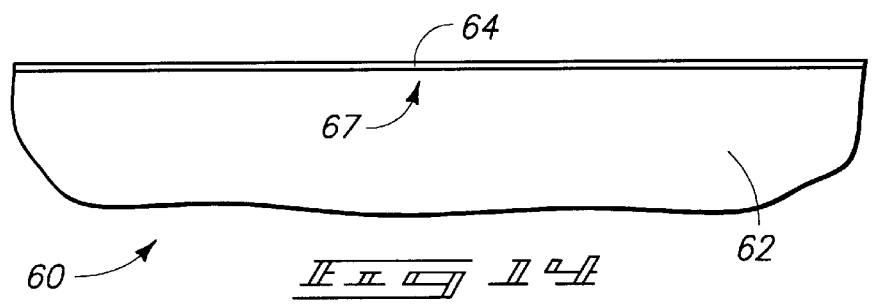
FIG. 14 is a diagrammatic sectional view of another alternate embodiment semiconductor wafer fragment at a processing step in accordance with an aspect of the invention.

A method of forming a field effect transistor in accordance with but one aspect of the invention is described with reference to FIGS. 14–16. FIG. 14 depicts a semiconductor wafer fragment 60 comprised of a bulk semiconductive substrate 62. A tungsten nitride comprising layer 64 is formed over substrate 62. Layer 64 preferably consists essentially of tungsten nitride, with an exemplary thickness being 20 Angstroms. Substrate 62 in the illustrated example will comprise a semiconductive channel region 67.

Figure 15:
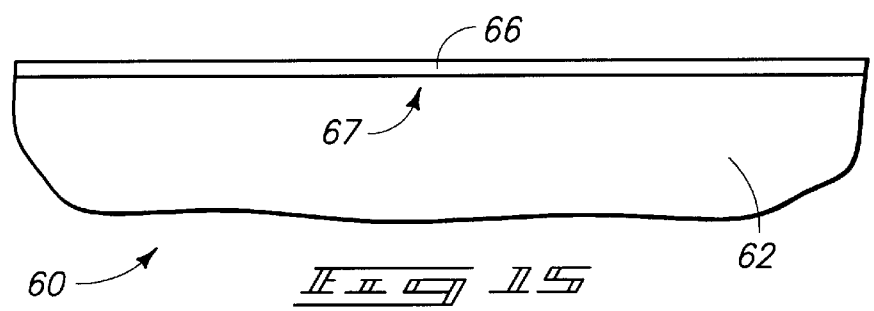
FIG. 15 is a view of the FIG. 14 wafer at a processing step subsequent to that shown by FIG. 14.

Referring to FIG. 15, tungsten nitride comprising layer 64 is oxidized under conditions effective to transform at least some of it, and preferably all as shown, to a tungsten oxide comprising gate dielectric layer 66. Preferably, at least a majority of the tungsten oxide is in tungsten trioxide form, and even more preferably, layer 66 consists essentially of tungsten trioxide. Layer 66 might also comprise $SiO_2$.

Figure 16:
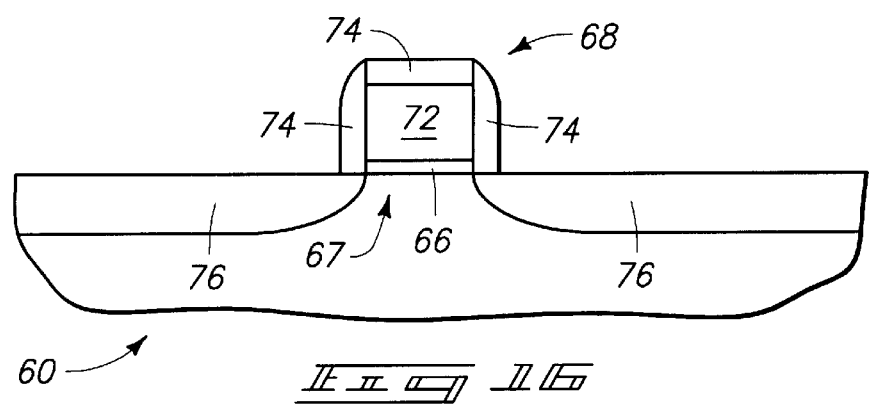
FIG. 16 is a view of the FIG. 15 wafer fragment at a processing step subsequent that shown by FIG. 15.

Referring to FIG. 16, a transistor gate construction 68 and source/drain regions 70 have been formed relative to the substrate. Gate construction 68 preferably comprises one or more conductive gate layers 72 which are capped by insulating sidewall spacers and caps 74. Gate 72 might comprise any unoxidized portion of tungsten nitride layer 64 which was converted to layer 66. Some provides but examples of providing a transistor gate 72 operably proximate gate dielectric layer 66, and source/drain regions 76 are provided operably proximate transistor gate 72. Preferably, gate 72 comprises tungsten nitride, and even more preferably consists essentially of tungsten nitride. Alternate processing could, of course, be provided for formation of a gate 72 operably proximate gate dielectric layer 66. Further, and by way of example, the transistor gate might be provided or otherwise formed prior to formation of tungsten oxide comprising gate dielectric region 66, such as by forming a bottom gated bulk or thin film transistor construction.

An alternate embodiment field effect transistor is described with reference to FIG. 17. Like numerals from the FIG. 16 embodiment are utilized where appropriate, with differences being indicated by the suffix "a" or with different numerals. Gate construction 68a comprises a gate dielectric region 80 comprising a combination of tungsten oxide and silicon dioxide. The tungsten oxide of gate dielectric region 80 preferably comprises tungsten dioxide or tungsten trioxide, and most preferably consists essentially of tungsten trioxide. In the preferred embodiment as shown, dielectric region 80 comprises a layer 81 and a layer 82, one of which preferably comprises tungsten oxide and the other of which comprises silicon dioxide. In such instances, either the tungsten oxide layer can be received over the silicon dioxide layer, or the silicon dioxide layer received over the tungsten oxide layer. Preferably, gate dielectric region 80 is the only dielectric region intermediate gate 72 and semiconductive channel 67, with the gate dielectric region consisting essentially of tungsten oxide and silicon dioxide.

Depicted layers 81 and 82 could be formed by any of a number of manners, including chemical vapor deposition and/or thermal oxidations. Gate 72 preferably comprises one or more conductive or semiconductive layers including tungsten in elemental or compound form, and/or conductively doped polysilicon. Tungsten nitride is one preferred material for gate 72.

An alternate method of forming a field effect transistor is described with reference to FIGS. 18–21. FIG. 18 depicts a semiconductor wafer fragment 84 comprised of a bulk semiconductive substrate 85. A beginning gate construction 87 has been formed, and comprises a gate dielectric region 88, a tungsten nitride comprising gate region 89 and an insulative capping layer 90. Such have preferably been patterned as shown.

Referring to FIG. 19, gate region 89 has been oxidized under conditions effective to transform at least some of the tungsten nitride to tungsten oxide. In the depicted embodiment, only some of the tungsten nitride has been oxidized to form tungsten oxide regions 91. Processing to produce the FIG. 19 construction might be dedicated or an undesired byproduct of the wafer processing. Further, such oxidizing and conditions might be effective to transform all of tungsten nitride comprising gate layer 89 of FIG. 18 to tungsten oxide.

Figure 20:
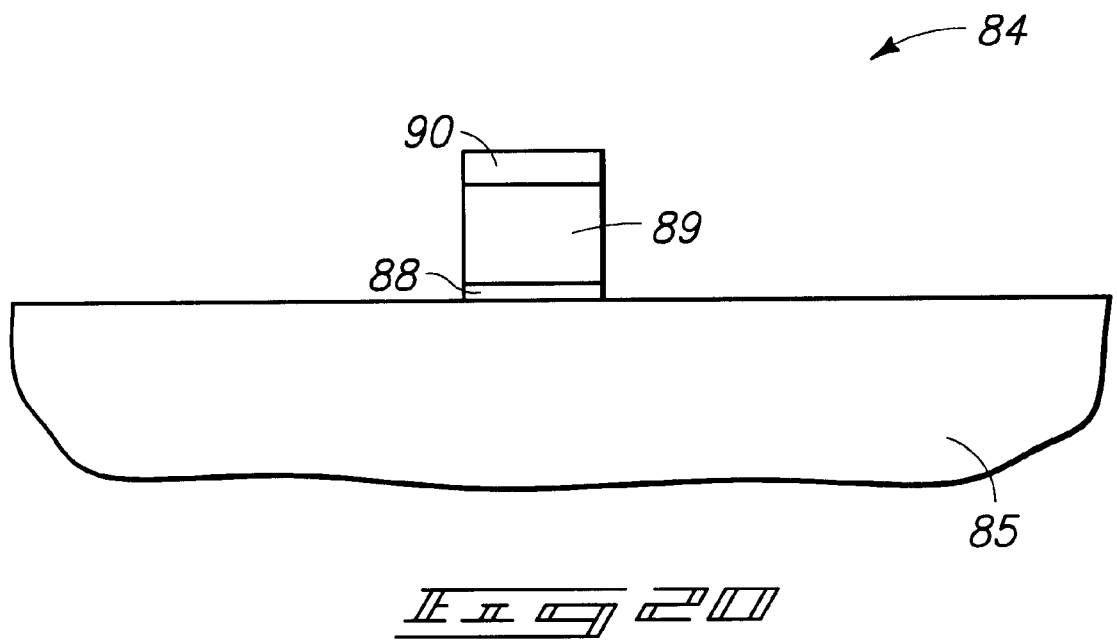
FIG. 20 is a view of the FIG. 18 wafer fragment at a processing step subsequent that shown by FIG. 19.

Referring to FIG. 20, the gate region has been nitridized under conditions effective to transform at least some of the tungsten oxide and preferably all as shown to tungsten nitride comprising material 89. The transformed tungsten nitride might be of the same, different or combination of forms as the term "tungsten nitride" has been defined earlier in this document. Example preferred nitridizing conditions include an atmosphere of one or both of $H_2/N_2$ and $NH_3$. Example preferred temperature during the processing is from 500° C. to 900° C. and from 1 Torr to atmospheric pressure. If just hydrogen or a very hydrogen enriched atmosphere is utilized, such example conditions would typically transform the tungsten oxide to elemental tungsten.

Figure 21:
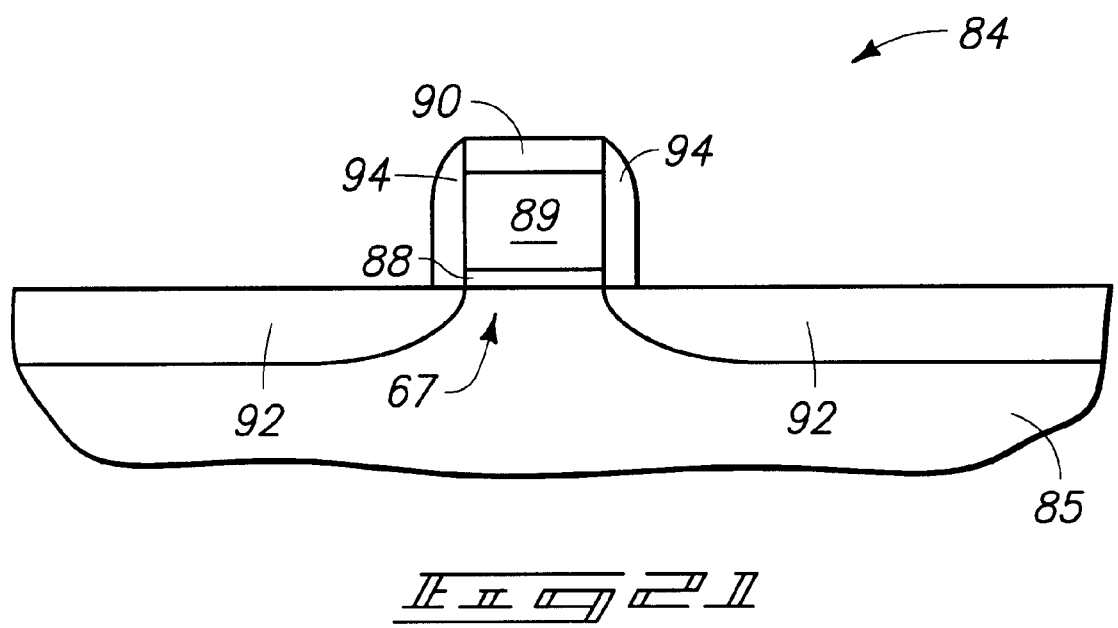
FIG. 21 is a view of the FIG. 18 wafer fragment at a processing step subsequent that shown by FIG. 20.

Referring to FIG. 21, source/drain regions 92 have been formed relative to the substrate, as well as insulative gate sidewall spacers 94.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A field effect transistor comprising:

a gate;

a semiconductive channel;

source/drain regions opposingly proximate the semiconductive channel;

a gate dielectric region intermediate the gate and the semiconductive channel; and the gate dielectric region comprising tungsten oxide, the gate comprising tungsten nitride.

2. The field effect transistor of claim 1 wherein the tungsten oxide of the gate dielectric region and the tungsten nitride of the gate are in contact with one another.

3. The field effect transistor of claim 1 wherein at least a majority of the tungsten oxide is in tungsten trioxide form.

4. The field effect transistor of claim 1 wherein the gate dielectric region is the only dielectric region intermediate the gate and the semiconductive channel, the gate dielectric region consisting essentially of tungsten oxide.

5. The field effect transistor of claim 1 wherein the gate dielectric region is the only dielectric region intermediate the gate and the semiconductive channel, the gate dielectric region consisting essentially of tungsten oxide, at least a majority of the tungsten oxide being in tungsten trioxide form.

6. The field effect transistor of claim 1 wherein the gate dielectric region is the only dielectric region intermediate the gate and the semiconductive channel, the gate dielectric region consisting essentially of tungsten oxide, essentially all of the tungsten oxide being in tungsten trioxide form.

7. A field effect transistor comprising:

a gate;

a semiconductive channel;

source/drain regions opposingly proximate the semiconductive channel; and a gate dielectric region intermediate the gate and the semiconductive channel, the gate dielectric region comprising a combination of tungsten oxide and silicon dioxide.

8. The field effect transistor of claim 7 wherein the tungsten oxide of the gate dielectric region comprises tungsten dioxide.

9. The field effect transistor of claim 7 wherein the tungsten oxide of the gate dielectric region comprises tungsten trioxide.

10. The field effect transistor of claim 7 wherein the tungsten oxide of the gate dielectric region consists essentially of tungsten trioxide.

11. The field effect transistor of claim 7 wherein the dielectric region comprises a tungsten oxide layer and a silicon dioxide layer, the tungsten oxide layer being received over the silicon dioxide layer.

12. The field effect transistor of claim 11 wherein the tungsten oxide layer consists essentially of tungsten trioxide.

13. The field effect transistor of claim 7 wherein the dielectric region comprises a tungsten oxide layer and a silicon dioxide layer, the silicon dioxide layer being received over the tungsten oxide layer.

14. The field effect transistor of claim 13 wherein the tungsten oxide layer consists essentially of tungsten trioxide.

15. The field effect transistor of claim 7 wherein the gate dielectric region is the only dielectric region intermediate the gate and the semiconductive channel, the gate dielectric region consisting essentially of tungsten oxide and silicon dioxide.

16. The field effect transistor of claim 15 wherein the tungsten oxide of the gate dielectric region consists essentially of tungsten trioxide.

17. The field effect transistor of claim 15 wherein the dielectric region comprises a tungsten oxide layer and a silicon dioxide layer, the tungsten oxide layer being received over the silicon dioxide layer.

18. The field effect transistor of claim 15 wherein the dielectric region comprises a tungsten oxide layer and a silicon dioxide layer, the silicon dioxide layer being received over the tungsten oxide layer.

19. A field effect transistor comprising:
   a gate comprising tungsten;
   a semiconductive channel;
   source/drain regions opposingly proximate the semiconductive channel; and
   a gate dielectric region intermediate the gate and the a semiconductive channel, the gate dielectric region comprising a combination of tungsten oxide and silicon dioxide.

20. The field effect transistor of claim 19 wherein the tungsten is in compound form.

21. The field effect transistor of claim 19 wherein the tungsten is in elemental form.

22. The field effect transistor of claim 21 wherein the tungsten oxide of the gate dielectric region comprises tungsten dioxide.

23. The field effect transistor of claim 21 wherein the tungsten oxide of the gate dielectric region comprises tungsten trioxide.

24. The field effect transistor of claim 21 wherein the tungsten oxide of the gate dielectric region consists essentially of tungsten trioxide.

25. The field effect transistor of claim 21 wherein the dielectric region comprises a tungsten oxide layer and a silicon dioxide layer, the tungsten oxide layer being received over the silicon dioxide layer.

26. The field effect transistor of claim 25 wherein the tungsten oxide layer consists essentially of tungsten trioxide.

27. The field effect transistor of claim 21 wherein the dielectric region comprises a tungsten oxide layer and a silicon dioxide layer, the silicon dioxide layer being received over the tungsten oxide layer.

28. The field effect transistor of claim 27 wherein the tungsten oxide layer consists essentially of tungsten trioxide.

29. The field effect transistor of claim 19 wherein the tungsten comprises tungsten nitride.

30. The field effect transistor of claim 29 wherein the tungsten oxide of the gate dielectric region comprises tungsten dioxide.

31. The field effect transistor of claim 29 wherein the tungsten oxide of the gate dielectric region comprises tungsten trioxide.

32. The field effect transistor of claim 29 wherein the tungsten oxide of the gate dielectric region consists essentially of tungsten trioxide.

33. The field effect transistor of claim 29 wherein the dielectric region comprises a tungsten oxide layer and a silicon dioxide layer, the tungsten oxide layer being received over the silicon dioxide layer.

34. The field effect transistor of claim 33 wherein the tungsten oxide layer consists essentially of tungsten trioxide.

* * * * *

UNITED STATES PATENT AND TRADEMARK OFFICE
CERTIFICATE OF CORRECTION

PATENT NO. : 6,555,473 B2
DATED : April 29, 2003
INVENTOR(S) : Haining Yang

It is certified that error appears in the above-identified patent and that said Letters Patent is hereby corrected as shown below:

Column 1,
Line 16, replace "(as Amended), naming Naming Yang as inventor, the" with
-- (as Amended), naming Haining Yang as inventor, the --

Column 2,
Line 44, replace "ductor wafer 1. fragment at one processing step in" with
-- ductor wafer fragment at one processing step in --

Column 4,
Line 66, replace "is about 40 for tungsten dioxide. Provision of a tungsten" with
-- about 40 for tungsten dioxide. Provision of a tungsten --

Column 9,
Line 31, replace "a gate dielectric region intermediate the gate and the a" with
-- a gate dielectric region intermediate the gate and the --

Signed and Sealed this

Twenty-third Day of September, 2003

JAMES E. ROGAN
*Director of the United States Patent and Trademark Office*